United States Patent
Park et al.

(10) Patent No.: US 9,013,201 B2
(45) Date of Patent: Apr. 21, 2015

(54) METHOD OF TESTING AN OBJECT AND APPARATUS FOR PERFORMING THE SAME

(75) Inventors: Jae-Ho Park, Asan-si (KR); Tea-Seog Um, Asan-si (KR); In-Sik Kim, Asan-si (KR); Suk-Lae Kim, Cheonan-si (KR); Yoon-Oh Han, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 401 days.

(21) Appl. No.: 13/534,088

(22) Filed: Jun. 27, 2012

(65) Prior Publication Data

US 2013/0118956 A1    May 16, 2013

(30) Foreign Application Priority Data

Nov. 10, 2011  (KR) .................. 10-2011-0117054

(51) Int. Cl.
  *B07C 5/344*  (2006.01)
  *G01R 31/28*  (2006.01)

(52) U.S. Cl.
  CPC ................ *G01R 31/2893* (2013.01)

(58) Field of Classification Search
  USPC .............. 324/759.03, 762.01, 762.02, 762.06
  See application file for complete search history.

(56) References Cited

U.S. PATENT DOCUMENTS

| 6,922,050 B2 | 7/2005 | Chung et al. |
| 2002/0130654 A1* | 9/2002 | Tauchi et al. ............. 324/158.1 |

FOREIGN PATENT DOCUMENTS

| KR | 10-2004-0032318 A | 4/2004 |
| KR | 10-0792488 B1 | 1/2008 |

* cited by examiner

*Primary Examiner* — Vincent Q Nguyen
(74) *Attorney, Agent, or Firm* — Lee & Morse, P.C.

(57) ABSTRACT

A method of testing objects and an apparatus for performing the same, the method including loading the objects into a testing unit through a loading unit; testing the objects in the testing unit and determining whether the objects are normal objects or abnormal objects; unloading the tested objects from the testing unit to an unloading unit; directly reversely loading the abnormal objects from the unloading unit into the testing unit when the objects are determined to be abnormal objects; and re-testing the abnormal objects in the testing unit.

14 Claims, 5 Drawing Sheets

METHOD OF TESTING AN OBJECT AND APPARATUS FOR PERFORMING THE SAME

CROSS-REFERENCE TO RELATED APPLICATION

Korean Patent Application No. 10-2011-0117054, filed on Nov. 10, 2011, in the Korean Intellectual Property Office (KIPO), entitled "METHOD OF TESTING AN OBJECT AND APPARATUS FOR PERFORMING THE SAME," is hereby incorporated by reference herein in its entirety.

BACKGROUND

1. Field

Embodiments relate to a method of testing an object and an apparatus for performing the same. For example, the embodiments provide a method of testing electrical characteristics of a semiconductor package and an apparatus for performing the method.

2. Description of the Related Art

A plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages. Electrical characteristics of the semiconductor package may be finally tested. The final test process may include a room temperature test and a high temperature test.

SUMMARY

Embodiments are directed to a method of testing an object and an apparatus for performing the same.

The embodiments may be provided by a method of testing an object, the method including loading the objects into a testing unit through a loading unit; testing the objects in the testing unit and determining whether the objects are normal objects or abnormal objects; unloading the tested objects from the testing unit to an unloading unit; directly reversely loading the abnormal objects from the unloading unit into the testing unit when the objects are determined to be abnormal objects; and re-testing the abnormal objects in the testing unit.

The method may further include heating the objects before loading the objects into the testing unit; and heating the abnormal objects before reversely loading the abnormal objects into the testing unit when the objects are determined to be abnormal objects.

The method may further include heating following objects while heating the abnormal objects.

The method may further include classifying the re-tested abnormal objects into final normal objects and final abnormal objects.

The objects may include semiconductor packages.

The embodiments may also be provided by an apparatus for testing objects, the apparatus including a testing unit that tests the objects to determine whet the objects are normal objects or abnormal objects; a loading unit that loads the objects into the testing unit; and an unloading unit that unloads the tested objects from the testing unit and directly reversely loads the abnormal objects into the testing unit when the objects are determined to be abnormal objects.

The loading unit may include a loading stocker that receives the objects; a first loading robot that transfers the objects from the loading stocker to an entrance of the testing unit; and a loading shuttle that transfers the object into the testing unit, the loading shuttle being at the entrance of the testing unit.

The loading unit may further include a first heating member that heats the objects, the first heating member being arranged between the loading stocker and the loading shuttle.

The loading unit may further include a second loading robot that transfers the objects from the loading stocker to the first heating member.

The unloading unit may include an unloading tray that receives the tested objects; an unloading shuttle that transfers the tested objects from the testing unit, the unloading shuttle being arranged at an exit of the testing unit; and a first unloading robot that transfers the tested objects from the unloading shuttle to the unloading tray and that directly reversely loads the abnormal objects into the testing unit.

The unloading unit may further include a second heating member that heats the abnormal objects, the second heating member being arranged between the unloading shuttle and the unloading tray.

The unloading unit may further include an unloading stocker that receives the unloading tray; and a second unloading robot that transfers the unloading tray to the unloading stocker.

The unloading unit may further include an auxiliary tray that receives remaining tested objects when the unloading tray is fully filled with the tested objects.

The embodiments may also be provided by a method of testing objects, the method including loading an object into a testing unit through a loading unit; testing the object in the testing unit and determining whether the object is a normal object or a preliminary abnormal object; unloading the tested object from the testing unit to an unloading unit; loading the preliminary abnormal object back into the testing unit from the unloading unit when the object is determined to be the preliminary abnormal object; and re-testing the preliminary abnormal object in the testing unit and determining whether the preliminary abnormal object is a final abnormal object or a final normal object.

The method may further include heating the object prior to loading the object into the testing unit; and heating the preliminary abnormal object prior to loading the preliminary abnormal object back into the testing unit when the object is determined to be the preliminary abnormal object.

The method may further include heating other objects in the loading unit while heating the preliminary abnormal object.

The objects may include semiconductor packages.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
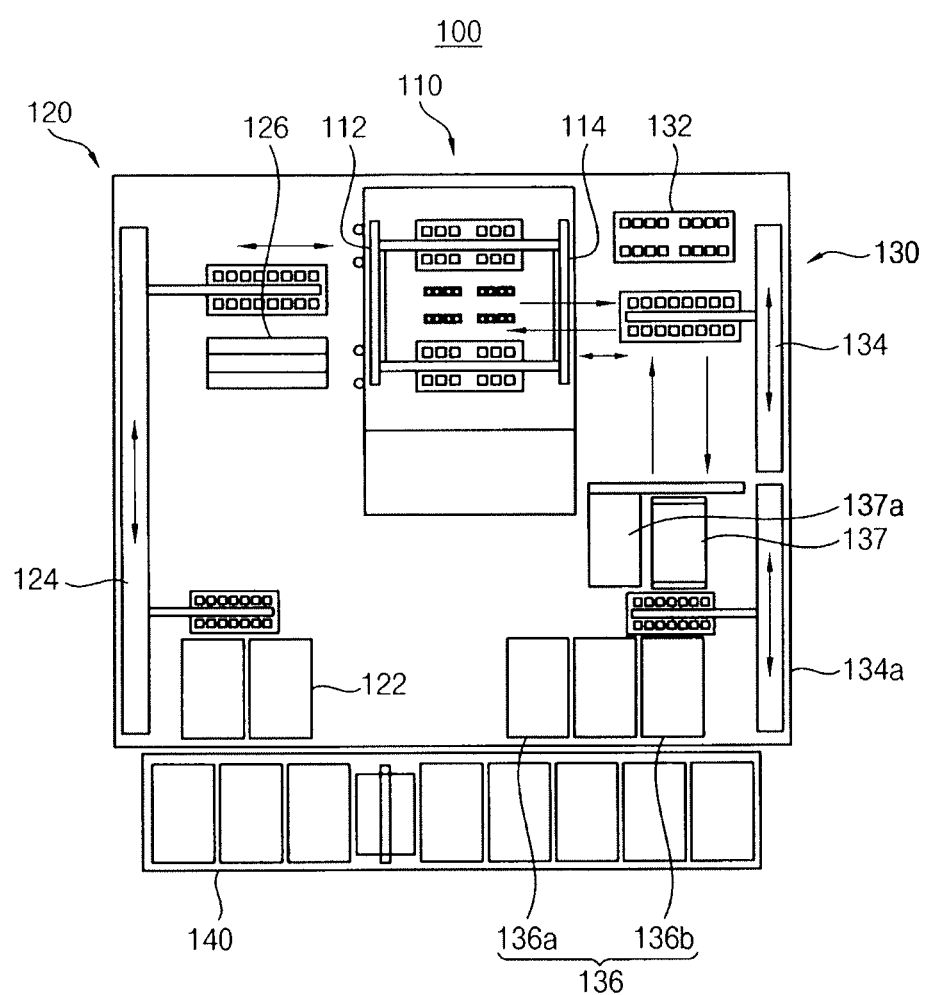
FIG. 1 illustrates a cross-sectional view of an apparatus for testing an object in accordance with an embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another element, it can be directly on the other element, or intervening elements may also be present. In addition, it will also be understood that when an element is referred to as being "between" two elements, it can be the only element between the two elements, or one or more intervening elements may also be present. Like reference numerals refer to like elements throughout.

As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of an apparatus for testing an object in accordance with an embodiment.

An apparatus 100 for testing an object in accordance with an embodiment may test electrical characteristics of the object at, e.g., room temperature. The object may include, e.g., a semiconductor package.

Referring to FIG. 1, the apparatus 100 may include a testing unit 110, a loading unit 120, an unloading unit 130, and a conveyor 140.

The testing unit 110 may test electrical characteristics of the semiconductor package. In an implementation, the testing unit 110 may include sockets that electrically contact external terminals of the semiconductor package. Test currents may be supplied to the external terminals through the sockets to thereby test the electrical characteristics of the semiconductor package. The testing unit 110 may include a loading door 112 (facing the loading unit 120) and an unloading door 114 (facing the unloading unit 130).

The loading unit 120 may load the semiconductor package into the testing unit 110. In an implementation, the loading unit 120 may include a loading stocker 122, a loading robot 124, and a loading shuttle 126.

The loading stocker 122 may receive the semiconductor package. The conveyor 140 may transfer the loading stocker 122. The loading shuttle 126 may be arranged adjacent to the loading door 112 at an entrance of the testing unit 110. The loading robot 124 may transfer the semiconductor package from the loading stocker 122 to the loading shuttle 126. The loading shuttle 126 may transfer the semiconductor packages to the testing unit 110 through the loading door 112.

The unloading unit 130 may unload the semiconductor package that has been tested by the testing unit 110. In an implementation, the unloading unit 130 may include an unloading shuttle 132, a first unloading robot 134, an unloading tray 137, a second unloading robot 134a, and an unloading stocker 136.

The unloading shuttle 132 may be arranged adjacent to the unloading door 114 at an exit of the testing unit 110 to unload the tested semiconductor package from the testing unit 110 through the unloading door 114.

The first unloading robot 134 may transfer the tested semiconductor package from the unloading shuttle 132 to the unloading tray 137. The first unloading robot 134 may reversely transfer an abnormal semiconductor package (if the tested semiconductor package in the unloading tray 137 has been determined to be an abnormal semiconductor package) to the unloading shuttle 132. For example, the first unloading robot 314 may transfer any semiconductor package that is determined to be an abnormal semiconductor package, e.g., a preliminary abnormal semiconductor package, back to the unloading shuttle 132.

The unloading shuttle 132 may then reversely load the abnormal semiconductor package into the testing unit 110 through the unloading door 114. For example, if the semiconductor package is determined to be a preliminary abnormal semiconductor package, the unloading shuttle 132 may load the preliminary abnormal semiconductor package back into the testing unit 110 through the unloading door 114. The testing unit 110 may then re-test the electrical characteristics of the abnormal semiconductor package (that has been reversely loaded from the unloading shuttle 132). For example, the testing unit 110 may determine if the preliminary abnormal semiconductor package is a final abnormal semiconductor package or a final normal semiconductor package. The re-tested semiconductor package (e.g., the final abnormal semiconductor package or the final normal semiconductor package) may be unloaded by the unloading shuttle 132 from the testing unit 110. The re-tested semiconductor package may be transferred by the first unloading robot 134 to the unloading tray 137.

In an implementation, the unloading shuttle 132 may transfer the abnormal semiconductor package, e.g., the preliminary abnormal semiconductor package, to a test region in the testing unit 110 in a same or similar manner as operation of the loading shuttle 126. Thus, the unloading shuttle 132 may have a structure substantially the same as or similar to that of the loading shuttle 126.

In an implementation, the abnormal semiconductor package (e.g., the package determined to be abnormal in the primary test) may be directly reversely loaded from the unloading unit 130 into the testing unit 110, rather than via the loading unit 120. Therefore, a time for re-testing the preliminary abnormal semiconductor package may be remarkably reduced.

The unloading stocker 136 may receive the tested semiconductor package as well as the re-tested semiconductor package, when the primary test determined that the semiconductor package was a preliminary abnormal semiconductor package. In an implementation, the unloading stocker 136 may include a first stocker 136a and a second stocker 136b. The first stocker 136a may receive a semiconductor package that has been finally determined to be normal, e.g., a normal semiconductor package or a final normal semiconductor package. The second stocker 136b may receive a semiconductor package that has been finally determined to be abnormal, e.g., a final abnormal semiconductor package. The conveyor 140 may transfer the unloading stocker 136.

The second unloading robot 134a may transfer the finally determined or tested semiconductor package from the unloading tray 137 to the unloading stocker 136. In an implementation, the second unloading robot 134a may have a structure substantially the same as that of the first unloading robot 134.

In an implementation, the unloading unit 130 may further include an auxiliary tray 137a. The auxiliary tray 137a may temporarily receive a remaining tested semiconductor package when the unloading tray 137 is fully filled with tested semiconductor packages.

Figure 2:
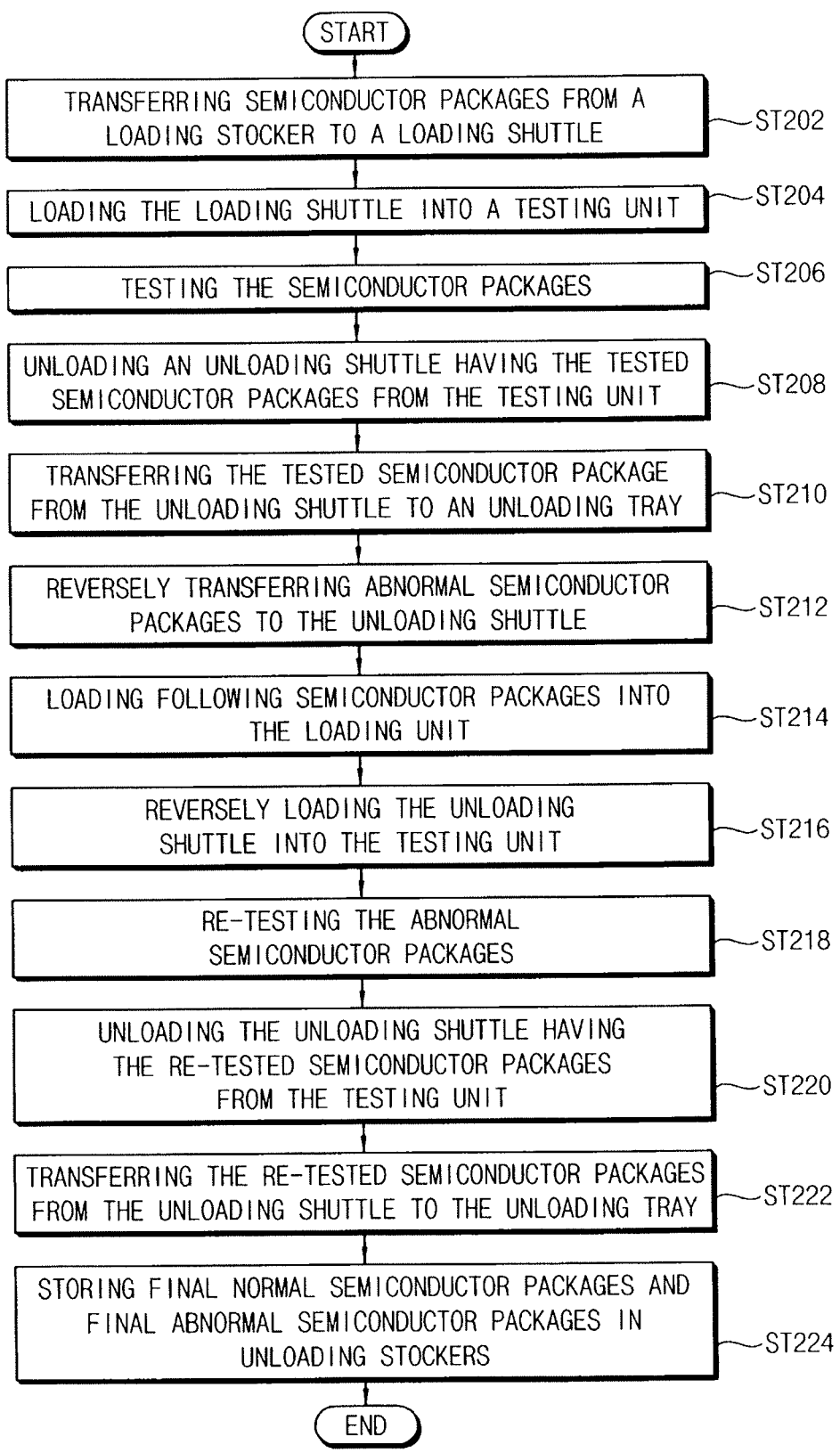
FIG. 2 illustrates a flow chart of a method of testing an object using the apparatus of FIG. 1.

FIG. 2 illustrates a flow chart of a method of testing an object using the apparatus of FIG. 1.

Referring to FIGS. 1 and 2, in step ST202, the loading robot 124 may transfer the semiconductor package from the loading stocker 122 to the loading shuttle 126.

In step ST204, the loading shuttle 126 may be loaded into the testing unit 110 through the loading door 112.

In step ST206, the testing unit 110 may test the electrical characteristics of the semiconductor package at, e.g., room temperature. In an implementation, the testing unit 110 may supply the test current to the external terminals of the semiconductor package through the sockets to test the electrical characteristics of the semiconductor package.

In step ST208, the unloading shuttle 132 (having or holding the tested semiconductor package) may be unloaded from the testing unit 110 through the unloading door 114.

In step ST210, the first unloading robot 134 may transfer the tested semiconductor package from the unloading shuttle 132 to the unloading tray 137.

In step ST212, if the tested semiconductor package is determined to be an abnormal semiconductor package, e.g., a preliminary abnormal semiconductor package, the first unloading robot 134 may reversely transfer the abnormal semiconductor package to the unloading shuttle 132. For example, the preliminary abnormal semiconductor package may not be transferred to the unloading stocker 126.

In an implementation, the abnormal semiconductor package may not be transferred to the loading unit 120. Thus, the loading unit 120 may be empty. Accordingly, in step ST214, a following semiconductor package may be loaded into the loading unit 120 while a preceding semiconductor package, e.g., an already tested semiconductor package, is tested or re-tested.

In step ST216, the unloading shuttle 132 (holding the abnormal semiconductor package) may be reversely loaded into the testing unit 110 through the unloading door 114. For example, the abnormal semiconductor package may be directly loaded from the unloading unit 130 into the testing unit 110, rather than via the loading unit 120.

In step ST218, the testing unit 110 may re-test the abnormal semiconductor package, e.g., the preliminary abnormal semiconductor package. In an implementation, the re-test may include processes substantially the same as or similar to those of the test.

In step ST220, the unloading shuttle 132 (holding the re-tested semiconductor package) may be unloaded from the testing unit 110.

In step ST222, the first unloading robot 134 may transfer the re-tested semiconductor package from the unloading shuttle 132 to the unloading tray 137. In an implementation, when the unloading tray 137 is fully filled with other tested semiconductor packages and re-tested semiconductor packages, the first unloading robot 134 may transfer the re-tested semiconductor package to the auxiliary tray 137a.

In step ST224, the second unloading robot 134a may transfer a final normal semiconductor package (e.g., a semiconductor package that has been finally determined to be normal) to the first unloading stocker 136a. In addition, the second unloading robot 134a may transfer a final abnormal semiconductor package (e.g., a semiconductor package that has been finally determined to be abnormal) to the second unloading stocker 136b. The final normal semiconductor package and the final abnormal semiconductor package may be stored in the first unloading stocker 136a and the second unloading stocker 136b, respectively. The conveyor 140 may unload the first unloading stocker 136a and the second unloading stocker 136b from the test apparatus 100.

According to the present embodiment, abnormal semiconductor packages, e.g., preliminary abnormal semiconductor packages may be directly reversely loaded from the unloading unit into the testing unit, rather than via the loading unit. Thus, a time for re-testing an abnormal semiconductor package may be remarkably shortened. Further, a following semiconductor package may be loaded into the testing unit while the abnormal semiconductor package is being re-tested, so that an overall test time may be further decreased.

Figure 3:
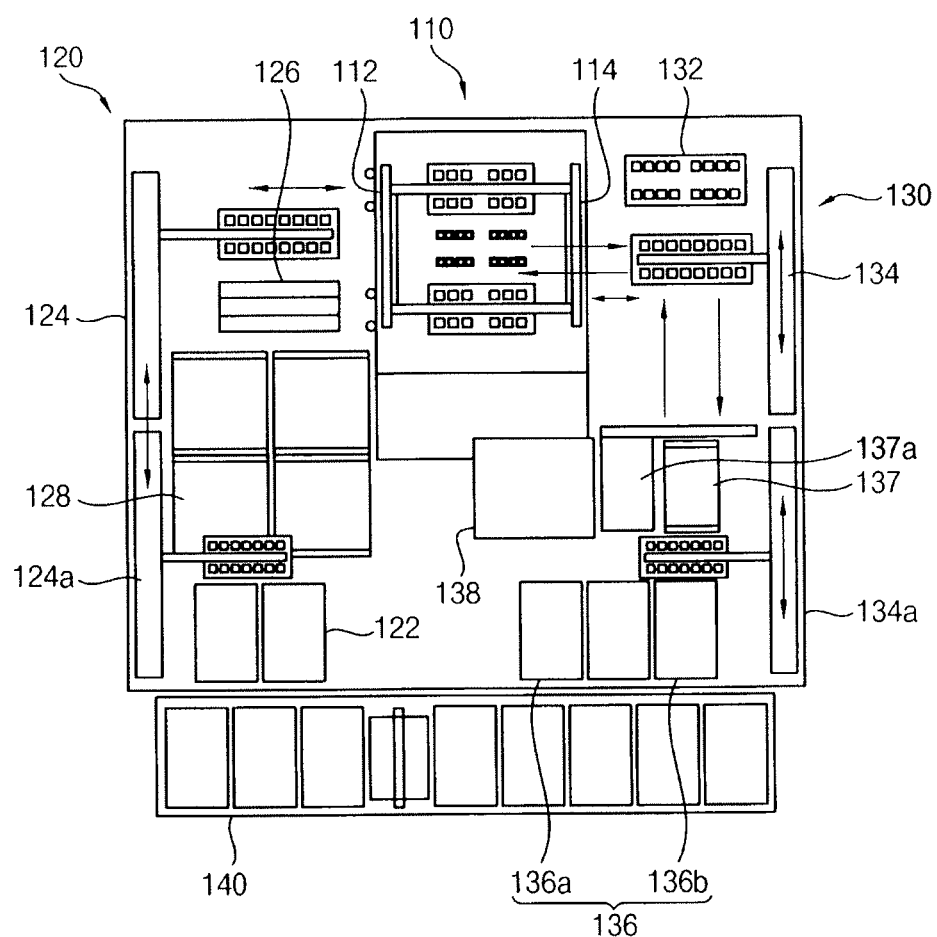
FIG. 3 illustrates a cross-sectional view of an apparatus for testing an object in accordance with an embodiment.

FIG. 3 illustrates a cross-sectional view of an apparatus for testing an object in accordance with an embodiment.

The apparatus 100a according to the present embodiment may test electrical characteristics of the object (e.g., semiconductor package) at a high temperature. Thus, the apparatus 100a may include elements substantially the same as those of the apparatus 100 in FIG. 1, and may further include a first heating member 128, a second loading robot 124a, and a second heating member 138. Thus, the same reference numerals refer to the same elements, and any further illustrations with respect to the same element may be omitted herein for brevity.

Referring to FIG. 3, the apparatus 100a according to the present embodiment may include the first heating member 128. The first heating member 128 may be between the loading stocker 122 and the loading shuttle 126. The first heating member 128 may heat the semiconductor package to provide the semiconductor package with the high temperature for the high temperature test. The second loading robot 124a may transfer the semiconductor package from the loading stocker 122 to the first heating member 128. In an implementation, the first heating member 128 may include a heating block that makes direct contact with the semiconductor package to thereby apply the heat to the semiconductor package. In an implementation, the first heating member 128 may include a hot fluid, e.g., a mechanism for heating the semiconductor package by way of providing a heated fluid thereto.

The first loading robot 124 may transfer the heated semiconductor package to the loading shuttle 126. In an implementation, the second loading robot 124a may have a structure substantially the same as that of the first loading robot 124.

The second heating member 138 may be between the unloading tray 137 and the unloading shuttle 132. The second heating member 138 may heat the abnormal semiconductor package, e.g., a preliminary abnormal semiconductor package, to provide the abnormal semiconductor package with the high temperature for the high temperature test. In an implementation, the unloading unit 130 may include the second heating member 138. Thus, the abnormal semiconductor package may not be transferred back to the loading unit 120 in order to heat the preliminary abnormal semiconductor package with the first heating member 128. For example, the heated abnormal semiconductor package may be directly re-transferred from the unloading unit 130 back to the testing unit 110. In an implementation, the second heating member 138 may have a structure substantially the same as that of the first heating member 128.

Figure 4A:
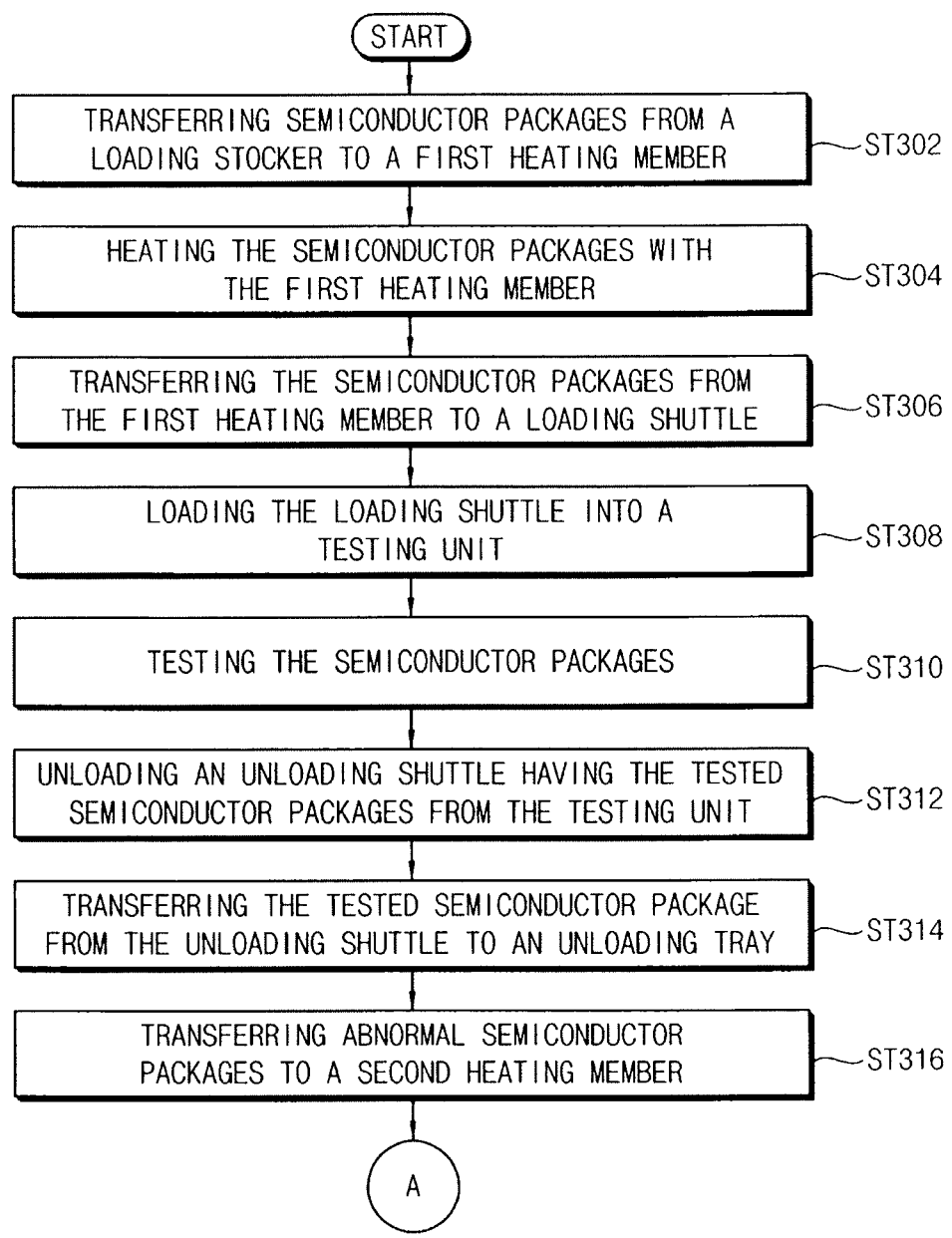
FIGS. 4A and 4B illustrate flow charts of a method of testing an object using the apparatus of FIG. 3.
Figure 4B:
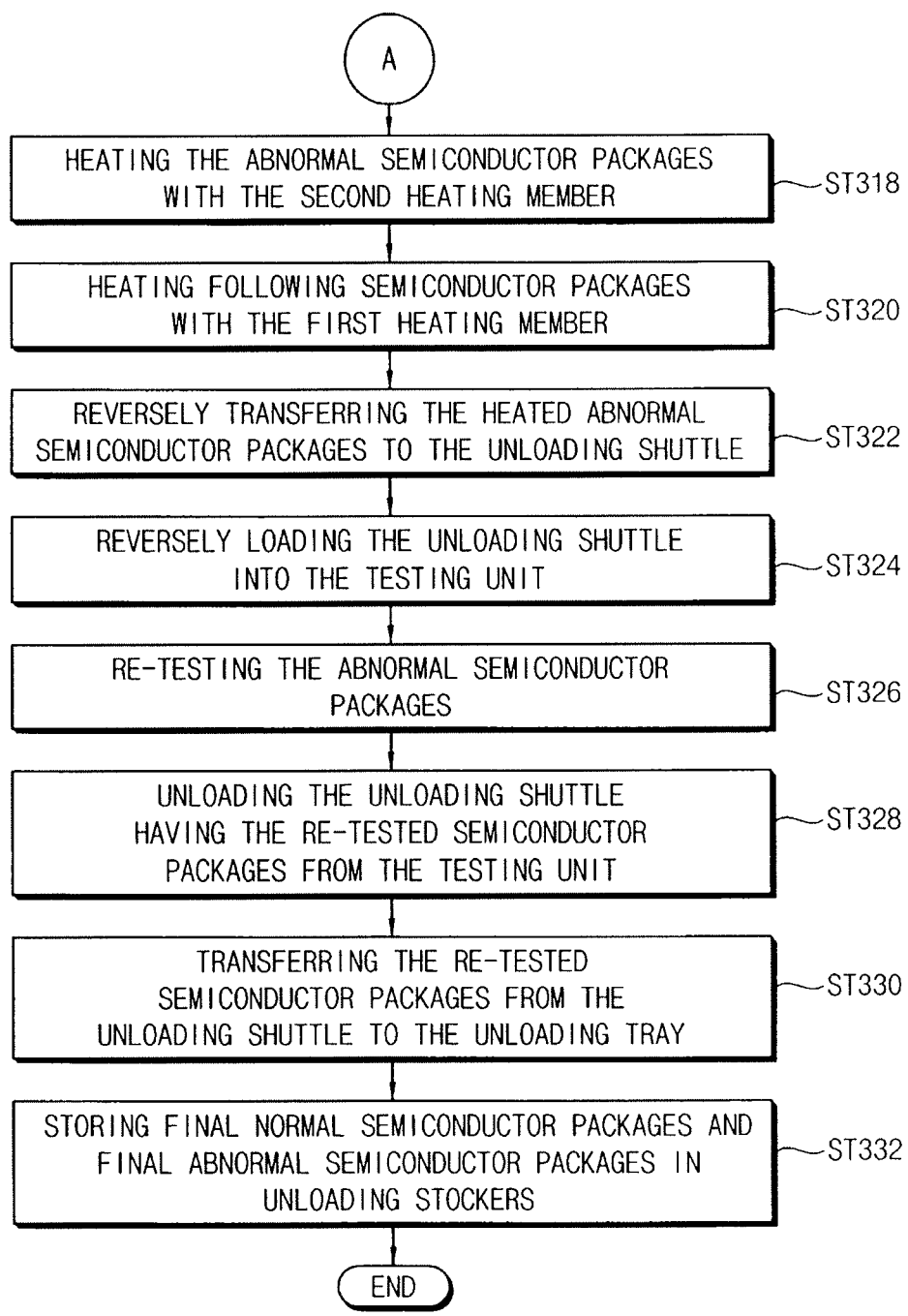

FIGS. 4A and 4B illustrate flow charts of a method of testing an object using the apparatus of FIG. 3.

Referring to FIGS. 3, 4A, and 4B, in step ST302, the second loading robot 124a may transfer the semiconductor package from the loading stocker 122 to the first heating member 128.

In step ST304, the first heating member 128 may heat the semiconductor package to provide the semiconductor package with the high temperature for the high temperature test.

In step ST306, the first loading robot 124 may transfer the heated semiconductor package from the first heating member 128 to the loading shuttle 126.

In step ST308, the loading shuttle 126 may be loaded into the testing unit 110 through the loading door 112.

In step ST310, the testing unit 110 may test the electrical characteristics of the semiconductor package at the high temperature.

In step ST312, the unloading shuttle 132 (having or holding the tested semiconductor package) may be unloaded from the testing unit 110 through the unloading door 114.

In step ST314, the first unloading robot 134 may transfer the tested semiconductor package from the unloading shuttle 132 to the unloading tray 137.

In step ST316, if the tested semiconductor package is determined to be an abnormal semiconductor package, e.g., a preliminary abnormal semiconductor package, the first unloading robot 134 may transfer the abnormal semiconductor package to the second heating member 138. In an implementation, transferring of the abnormal semiconductor package to the first heating member 128 may be omitted.

In step ST318, the second heating member 138 may heat the abnormal semiconductor package, e.g., the preliminary abnormal semiconductor package to provide the abnormal semiconductor package with the high temperature.

In an implementation, transferring of the abnormal semiconductor package to the loading unit 120 may be avoided. Thus, the loading unit 120 may be empty, e.g., free of preliminary abnormal semiconductor packages for re-testing. Accordingly, in step ST320, a following semiconductor package may be loaded into the loading unit 120. The first heating member 128 may heat the following semiconductor package.

In step ST322, the first unloading robot 134 may reversely transfer the heated abnormal semiconductor package to the unloading shuttle 132. For example, the first unloading robot 134 may transfer the preliminary abnormal semiconductor package back to the unloading shuttle 132.

In step ST324, the unloading shuttle 132 (holding the heated abnormal semiconductor package, e.g., the heated preliminary abnormal semiconductor package) may be reversely loaded into the testing unit 110 through the unloading door 114. For example, the heated abnormal semiconductor package may be heated by the second heating member 138 and then directly loaded reversely from the unloading unit 130 into the testing unit 110, rather than via the loading unit 120.

In step ST326, the testing unit 110 may re-test the heated abnormal semiconductor package, e.g., the heated preliminary abnormal semiconductor package.

In step ST328, the unloading shuttle 132 (holding the re-tested semiconductor package) may be unloaded from the testing unit 110.

In step ST330, the first unloading robot 134 may transfer the re-tested semiconductor package from the unloading shuttle 132 to the unloading tray 137. In an implementation, when the unloading tray 137 is fully filled with tested semiconductor packages and re-tested semiconductor packages, the first unloading robot 134 may transfer remaining re-tested semiconductor packages to the auxiliary tray 137a.

In step ST332, the second unloading robot 134a may transfer a normal semiconductor package (that has been finally determined to be normal, e.g., a final normal semiconductor package) to the first unloading stocker 136a. The second unloading robot 134a may transfer an abnormal semiconductor package (that has been finally determined to be abnormal, e.g., a final abnormal semiconductor package) to the second unloading stocker 136b. The conveyor 140 may unload the first unloading stocker 136a and the second unloading stocker 136b from the test apparatus 100.

According to the present embodiment, the abnormal semiconductor package, e.g., the preliminary abnormal semiconductor package may be heated by the second heating member and then directly loaded reversely from the unloading unit into the testing unit, rather than via the loading unit. Thus, a time for re-testing the abnormal semiconductor package may be remarkably shortened or reduced. Further, the following semiconductor package may be heated while the abnormal semiconductor package is being heated, so that the overall test time may be further decreased.

In an implementation, the object may include the semiconductor package. In an implementation, the object may not be restricted to the semiconductor package. For example, other electronic devices may be tested using the method and the apparatus of above-mentioned embodiments.

According to an embodiment, the abnormal object, e.g., a preliminary abnormal object may be directly reversely loaded from the unloading unit into the testing unit, rather than via the loading unit. Thus, a time for re-testing the abnormal object may be remarkably shortened. For example, the second heating member for heating the abnormal object may be arranged at the unloading unit, so that a following object may be heated using the first heating member. Therefore, standing by or pausing of the following object may be avoided, and the test and/or re-test time may be greatly reduced.

By way of summation and review, a test apparatus may include a testing unit, a loading unit, and an unloading unit. The loading unit may load the semiconductor packages into the testing unit. When the final test process includes the high temperature test, a heating member for heating the semiconductor packages may be arranged in the loading unit. The testing unit may test electrical characteristics of the semiconductor packages. The unloading unit may unload tested semiconductor packages from the testing unit. Further, the unloading unit may classify the tested semiconductor packages into normal semiconductor packages and abnormal semiconductor packages. The unloading unit may transfer the normal semiconductor packages to a normal tray and the abnormal semiconductor packages to an abnormal tray.

The normal semiconductor packages may be determined to be abnormal due to errors of the testing unit (e.g., rather than an actual error or abnormality in the semiconductor package). Thus, the abnormal semiconductor packages may be re-tested.

In a re-test method, the abnormal tray (holding the abnormal semiconductor packages) may be transferred to the loading unit. The heating member may heat the abnormal semiconductor packages. The testing unit may then re-test the heated abnormal semiconductor packages.

Accordingly, in order to re-test the abnormal semiconductor packages, the abnormal semiconductor packages may be loaded into the testing unit through the loading unit, so that a re-test time may be long. For example, when the re-test process includes the high temperature test, the re-test time may include a time for heating the abnormal semiconductor packages, so that the re-test time may be increased. Furthermore, during heating the abnormal semiconductor packages, following, e.g., yet untested, semiconductor packages may be on standby, i.e., may sit idle or be paused, so that the re-test process may delay the overall testing process.

The embodiments provide a method of testing an object that is capable of reducing a re-test time.

The embodiments also provide an apparatus for performing the above-mentioned method.

According to an embodiment, abnormal objects may be directly reversely loaded from the unloading unit into the testing unit, rather than via the loading unit. Thus, a time for re-testing the abnormal objects may be remarkably shortened. For example, the second heating member (for heating the abnormal objects) may be disposed or arranged at the unloading unit, so that the following, e.g., yet untested, objects may still be heated using the first heating member. Therefore, standing by or pausing testing of the following objects may be avoided, so that overall testing and/or re-testing times may be greatly reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of testing an object, the method comprising:
   loading the objects into a testing unit through a loading unit;
   heating the objects before loading the objects into the testing unit;
   testing the objects in the testing unit and determining whether the objects are normal objects or abnormal objects;
   unloading the tested objects from the testing unit to an unloading unit;
   directly reversely loading the abnormal objects from the unloading unit into the testing unit when the objects are determined to be abnormal objects;
   heating the abnormal objects using a heating member before reversely loading the abnormal objects into the testing unit when the objects are determined to be abnormal objects; and
   re-testing the abnormal objects in the testing unit.

2. The method as claimed in claim 1, further comprising heating following objects while heating the abnormal objects.

3. The method as claimed in claim 1, further comprising classifying the re-tested abnormal objects into final normal objects and final abnormal objects.

4. The method as claimed in claim 1, wherein the objects include semiconductor packages.

5. An apparatus for testing objects, the apparatus comprising:
   a testing unit that tests the objects to determine whether the objects are normal objects or abnormal objects;
   a loading unit that loads the objects into the testing unit; and
   an unloading unit that unloads the tested objects from the testing unit and directly reversely loads the abnormal objects into the testing unit when the objects are determined to be abnormal objects, the unloading unit including:
      an unloading tray that receives the tested objects;
      an unloading shuttle that transfers the tested objects from the testing unit, the unloading shuttle being arranged at an exit of the testing unit; and
      a second heating member that heats the abnormal objects, the second heating member being arranged between the unloading shuttle and the unloading tray.

6. The apparatus as claimed in claim 5, wherein the loading unit includes:
   a loading stocker that receives the objects;
   a first loading robot that transfers the objects from the loading stocker to an entrance of the testing unit; and a loading shuttle that transfers the object into the testing unit, the loading shuttle being at the entrance of the testing unit.

7. The apparatus as claimed in claim 6, wherein the loading unit further includes a first heating member that heats the objects, the first heating member being arranged between the loading stocker and the loading shuttle.

8. The apparatus as claimed in claim 7, wherein the loading unit further includes a second loading robot that transfers the objects from the loading stocker to the first heating member.

9. The apparatus as claimed in claim 5, wherein the unloading unit further includes:
a first unloading robot that transfers the tested objects from the unloading shuttle to the unloading tray and that directly reversely loads the abnormal objects into the testing unit.

10. The apparatus as claimed in claim 9, wherein the unloading unit further includes:
an unloading stocker that receives the unloading tray; and
a second unloading robot that transfers the unloading tray to the unloading stocker.

11. The apparatus as claimed in claim 9, wherein the unloading unit further includes an auxiliary tray that receives remaining tested objects when the unloading tray is fully filled with the tested objects.

12. A method of testing objects, the method comprising:
loading an object into a testing unit through a loading unit;
heating the object prior to loading the object into the testing unit;
testing the object in the testing unit and determining whether the object is a normal object or a preliminary abnormal object;
unloading the tested object from the testing unit to an unloading unit;
loading the preliminary abnormal object back into the testing unit from the unloading unit when the object is determined to be the preliminary abnormal object;
heating the preliminary abnormal object using a heating member prior to loading the preliminary abnormal object back into the testing unit when the object is determined to be the preliminary abnormal object; and
re-testing the preliminary abnormal object in the testing unit and determining whether the preliminary abnormal object is a final abnormal object or a final normal object.

13. The method as claimed in claim 12, further comprising heating other objects in the loading unit while heating the preliminary abnormal object.

14. The method as claimed in claim 12, wherein the objects include semiconductor packages.

* * * * *